(12) United States Patent
Tsai et al.

(10) Patent No.: US 10,631,400 B1
(45) Date of Patent: Apr. 21, 2020

(54) STRAIN GAUGE DRIVING PIEZOELECTRIC DEVICE

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Pei-Jung Tsai, Shenzhen (CN); Yu-Chieh Tu, Shenzhen (CN)

(73) Assignees: Interface Technology (Chengdu) Co., Ltd., Chengdu, Sichuan (CN); Interface Optoelectronics (Shenzhen) Co., Ltd., Shenzhen, Guangdong (CN); General Interface Solution Limited, Miaoli County (TW)

( * ) Notice: Subject to any disclaimer, the term of this patent is extended or adjusted under 35 U.S.C. 154(b) by 0 days.

(21) Appl. No.: 16/351,977

(22) Filed: Mar. 13, 2019

(30) Foreign Application Priority Data

Jan. 17, 2019 (CN) .......................... 2019 1 0043206

(51) Int. Cl.
*G01L 5/00* (2006.01)
*H05K 1/02* (2006.01)
(Continued)

(52) U.S. Cl.
CPC .............. *H05K 1/0271* (2013.01); *G01L 1/16* (2013.01); *G01L 5/0047* (2013.01); *H01L 41/0471* (2013.01); *H01L 41/0472* (2013.01); *H01L 41/0475* (2013.01); *H01L 41/0838* (2013.01); *H05K 1/147* (2013.01); *H05K 2201/10151* (2013.01)

(58) Field of Classification Search
CPC ................. H05K 1/0271; H05K 1/147; H05K 2201/1015; G01L 1/16; G01L 5/0047; H01L 41/0471; H01L 41/0472; H01L 41/0475; H01L 41/0838
USPC .......................................................... 73/769
See application file for complete search history.

(56) References Cited

U.S. PATENT DOCUMENTS 4,478,089 A * 10/1984 Aviles .................... B25J 13/082
  294/907
5,656,882 A * 8/1997 Lazarus .............. G03F 7/70725
  310/328

(Continued)

*Primary Examiner* — Max H Noori
(74) *Attorney, Agent, or Firm* — Rosenberg, Klein & Lee (57) ABSTRACT

A strain gauge driving piezoelectric device is disclosed. A piezoelectric element is arranged between a plurality of layers of first strain gauges correspondingly spaced from each other and a plurality of layers of second strain gauges correspondingly spaced from each other. The first strain gauges and the second strain gauges are arranged on different layers of the flexible circuit board. The first strain gauges and the second strain gauges generate a driving voltage according to variations of resistance values of the first strain gauges and the second strain gauges when a stress is applied to the flexible circuit board, and the driving voltage induces the piezoelectric effect of the piezoelectric element and then drives the piezoelectric element to generate an output voltage for haptic feedback.

10 Claims, 6 Drawing Sheets

(51) Int. Cl.
*H05K 1/14* (2006.01)
*G01L 1/16* (2006.01)
*H01L 41/047* (2006.01)
*H01L 41/083* (2006.01)

(56) References Cited

U.S. PATENT DOCUMENTS

| | | | | |
|---|---|---|---|---|
| 9,114,616 | B2 * | 8/2015 | Sakaida | B41J 2/14209 |
| 2002/0073783 | A1 * | 6/2002 | Wilner | A61B 3/16 |
| | | | | 73/716 |
| 2008/0100676 | A1 * | 5/2008 | Sakaida | B41J 2/14209 |
| | | | | 347/70 |
| 2013/0326863 | A1 * | 12/2013 | Menassa | G01L 1/22 |
| | | | | 29/621.1 |
| 2014/0204285 | A1 * | 7/2014 | Jang | G06F 3/0412 |
| | | | | 349/12 |

* cited by examiner

STRAIN GAUGE DRIVING PIEZOELECTRIC DEVICE

This application claims priority for China patent application no. 201910043206.5 filed on Jan. 17, 2019, the content of which is incorporated by reference in its entirety.

BACKGROUND OF THE INVENTION

Field of the Invention

The present invention relates to a strain gauge driving piezoelectric device, particularly to a strain gauge driving piezoelectric device with a plurality of layers of strain gauges that can avoid the output voltage of a Wheatstone bridge circuit being zero.

Description of the Related Art

With the rapid development of technology, in order to increase the interaction mode between electronic devices and users, there are many electronic devices that have input components for users, such as physical or virtual keyboards, and additional components for haptic feedback. The additional components are usually installed in a position close to the external case of the electronic device, such that a part of regions of the electronic device vibrates. Thus, users feel vibrations to achieve the purpose of feedback or interaction. In general, input devices are provided with pressured sensors, such as capacitive force sensors, resistive force sensors, or strain gauge driving force sensors. The force sensor is used to detect the input motion of a user. Presently, the electronic device is provided with an actuator therein that can vibrate and cause the haptic feedback.

However, the electronic device presently trends to slimness and compactness. Regardless of using any type of force sensors and actuators, the force sensor and the actuator are both installed within the electronic device to occupy different spaces and increase the cost of material, which conflicts with the trend of saving space. As a result, piezoelectric material is used to perform a function of haptic feedback. Due to the special arrangement of lattices among atoms of piezoelectric material, the lattice has an asymmetric center to cause piezoelectric phenomena. That is to say, the piezoelectric material is a dielectric material that converts mechanical energy into voltages to produce the piezoelectric effect. The piezoelectric effect is divided into the direct piezoelectric effect or the converse piezoelectric effect. The direct piezoelectric effect represents that electric dipole moment within the piezoelectric material can be deformed to generate charges when pressing or stretching the piezoelectric material. The converse piezoelectric effect represents that the piezoelectric material receives a voltage to mechanically deform. Presently, piezoelectric elements actively invested and developed by various industries are greatly applied to touch devices since the piezoelectric elements feature small volumes, light weight, high power conversion efficiency, high reliability, excellent insulativity, and no electromagnetic interference (EMI).

The upper surface and the lower surface of the piezoelectric plate applied to the touch device respectively have two electrodes that are symmetric to each other. Four strain gauges are fabricated on the surface of a metal core printed circuit board (MCPCB). The resistances of the four strain gauges vary to generate an output voltage for haptic feedback when a finger presses the MCPCB. However, the output voltage easily becomes zero in this design. In addition, the MCPCB is easily cracked due to the high temperature caused by long-term haptic feedback, and the resistivity and sensitivity of the strain gauges vary with temperature, such that results measured by the strain gauges are incorrect. As a result, the amount of deformation and the sensitivity of the strain gauge should be tested in application and the package process of the strain gauge is quite complicated. How to simplify the package process and improve the sensitivity of the strain gauge is a problem to be solved.

To overcome the abovementioned problems, the present invention provides a strain gauge driving piezoelectric device, so as to solve the afore-mentioned problems of the prior art.

SUMMARY OF THE INVENTION

The primary objective of the present invention is to provide a strain gauge driving piezoelectric device, which respectively arranges two independent Wheatstone bridge circuits at two sides of a piezoelectric element. A plurality of layers of one of strain gauges of each Wheatstone bridge circuit are cascaded to each other and formed in a flexible circuit board, and the remaining strain gauges of each Wheatstone bridge circuit are formed in an external circuit board. This design can guarantee the output voltage of the Wheatstone bridge circuits to be non-zero and improve the sensitivity of strain gauges.

Another objective of the present invention is to provide a strain gauge driving piezoelectric device, which uses the asymmetric electrode layers of the upper and lower surfaces of a piezoelectric element to effectively determine internal polarization directions and the distribution of positive and negative charges within the piezoelectric element.

Further objective of the present invention is to provide a strain gauge driving piezoelectric device, which forms a plurality of layers of strain gauges on different layers of a flexible circuit board and uses a conductive glue to cascade the plurality of layers of strain gauges. The directions of winding the conductive metal wires of neighboring two of the plurality of layers of strain gauges are perpendicular to each other. The area of a topmost one of the plurality of layers of strain gauges is less than the area of each of remains of the plurality of layers of strain gauges, and the areas of the remains of the plurality of layers of strain gauges are equal. This design can improve the sensitivity for detecting the amount of deformation in the X, Y, and Z directions, applies to touch products to cause the more precise haptic feedback, and possesses the market competitiveness.

To achieve the abovementioned objectives, the present invention provides a strain gauge driving piezoelectric device, which comprises a flexible circuit board, a piezoelectric element, and a package body encapsulating the flexible circuit board and the piezoelectric element. The flexible circuit board comprises a plurality of layers of first strain gauges correspondingly spaced from each other and a plurality of layers of second strain gauges correspondingly spaced from each other. The first strain gauges are arranged on different layers of the flexible circuit board. The second strain gauges are arranged on different layers of the flexible circuit board. The plurality of layers of the first strain gauges and the plurality of layers of the second strain gauges are respectively cascaded through conductive glues. The piezoelectric element is arranged on the flexible circuit board and arranged between the plurality of layers of the first strain gauges and the plurality of layers of the second strain gauges. The upper surface and the lower surface of the piezoelectric element respectively have a first electrode layer and a second electrode layer. The shape of the first electrode layer is asymmetric to the shape of the second electrode layer. The first strain gauges and the second strain gauges generate a driving voltage according to variations of resistance values of the first strain gauges and the second strain gauges when a stress is applied to the flexible circuit board, and the driving voltage induces a piezoelectric effect of the piezoelectric element and then drives the piezoelectric element to generate an output voltage.

In an embodiment of the present invention, each of the plurality of layers of the first strain gauges and each of the plurality of layers of the second strain gauges are formed by winding conductive metal wires, and directions of winding the conductive metal wires of neighboring two of the plurality of layers of the first strain gauges and the plurality of layers of the second strain gauges are perpendicular to each other. Thus, the amount of deformation that is detected to improve the sensitivity while applying a force.

In an embodiment of the present invention, the flexible circuit board is electrically connected to an external circuit board, the external circuit board comprises a first Wheatstone bridge circuit and a second Wheatstone bridge circuit that correspond to each other, the first Wheatstone bridge circuit includes three third strain gauges and electrically connects to the first strain gauges to form a full-bridge circuit, the second Wheatstone bridge circuit includes three fourth strain gauges and electrically connects to the second strain gauges to form a full-bridge circuit, and the first Wheatstone bridge circuit and the second Wheatstone bridge circuit adjust the driving voltage to non-zero.

The voltage generated by the strain gauge is very small. In an embodiment of the present invention, the strain gauge driving piezoelectric device further comprises a vibration sensing amplifier, a microcontroller, a piezoelectric tactile driver, and a transformer that are electrically connected to each other, the vibration sensing amplifier electrically connected to the flexible circuit board amplifies the driving voltage to generate a first amplified voltage, the microcontroller uses the first amplified voltage to start the piezoelectric tactile driver, the piezoelectric tactile driver converts the first amplified voltage and then transmits it to the transformer, the transformer amplifies the converted first amplified voltage to generate a second amplified voltage, and uses the second amplified voltage to induce the piezoelectric effect of the piezoelectric element and then to drive the piezoelectric element to generate the output voltage.

In an embodiment of the present invention, each of the plurality of layers of the first strain gauges and each of the plurality of layers of the second strain gauges are formed by winding conductive copper wires, the conductive copper wire of each of the plurality of layers of the first strain gauges and the plurality of layers of the second strain gauges is divided into line segments in parallel to each other, a line spacing between neighboring two of the line segments has a range of 38-42 μm, the conductive copper wire has a width of 38-42 μm, the conductive copper wire has a thickness of 16-20 μm, the plurality of layers of the first strain gauges and the plurality of layers of the second strain gauges are respectively cascaded through conductive copper glues, the total resistance value of the plurality of layers of the cascaded first strain gauges has a range of 960~1160 ohms, and the total resistance value of the plurality of layers of the cascaded second strain gauges has a range of 960~1160 ohms. The higher rated resistance can reduce the heat generated by exciting voltages and the variation of signals.

Below, the embodiments are described in detail in cooperation with the drawings to make easily understood the technical contents, characteristics and accomplishments of the present invention.

DETAILED DESCRIPTION OF THE INVENTION

In order to refine touch products in requirement and application, the present invention discloses a strain gauge driving piezoelectric device with a simple fabrication process and an economical benefit after years of painstaking research.

Figure 1:
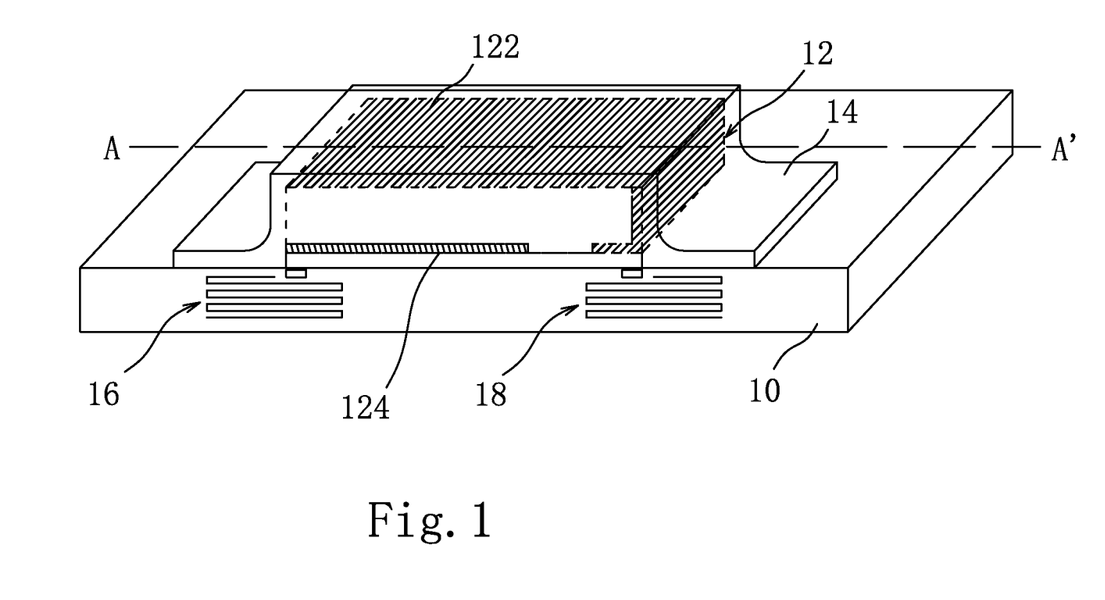
FIG. 1 is a perspective view of a strain gauge driving piezoelectric device according to an embodiment of the present invention.

FIG. 1 is a perspective view of a strain gauge driving piezoelectric device according to an embodiment of the present invention. The strain gauge driving piezoelectric device comprises a flexible circuit board (FPC) 10, a piezoelectric element 12, and a package body 14. The flexible circuit board 10 comprises a plurality of layers of first strain gauges 16 correspondingly spaced from each other and a plurality of layers of second strain gauges 18 correspondingly spaced from each other. The first strain gauges 16 are arranged on different layers of the flexible circuit board 10, and the second strain gauges 18 are arranged on different layers of the flexible circuit board 10. The piezoelectric element 12 is arranged on the flexible circuit board 10 and arranged between the plurality of layers of the first strain gauges 16 and the plurality of layers of the second strain gauges 18. The upper surface and the lower surface of the piezoelectric element 12 respectively have a first electrode layer 122 and a second electrode layer 124, wherein the shape of the first electrode layer 122 is asymmetric to the shape of the second electrode layer 124. The package body 14 encapsulates the flexible circuit board 10 and the piezoelectric element 12 to complete the package process of the strain gauge driving piezoelectric device. The first strain gauges 16 and the second strain gauges 18 generate a driving voltage according to variations of resistance values of the first strain gauges 16 and the second strain gauges 18 when a stress is applied to the flexible circuit board 10, and the driving voltage induces the piezoelectric effect of the piezoelectric element 12 and then drives the piezoelectric element 12 to generate an output voltage. The piezoelectric element 12 is a ceramic piezoelectric element, and the first electrode layer 122 and the second electrode layer 124 are silver electrode layers. Since the shape of the first electrode layer 122 is asymmetric to the shape of the second electrode layer 124, the internal polarization directions and the distribution of positive and negative charges of the ceramic piezoelectric element are determined when the strain gauge driving piezoelectric device is fabricated. This way, the precision of a wire-connecting method can be improved when the piezoelectric device is driven.

Figure 2:
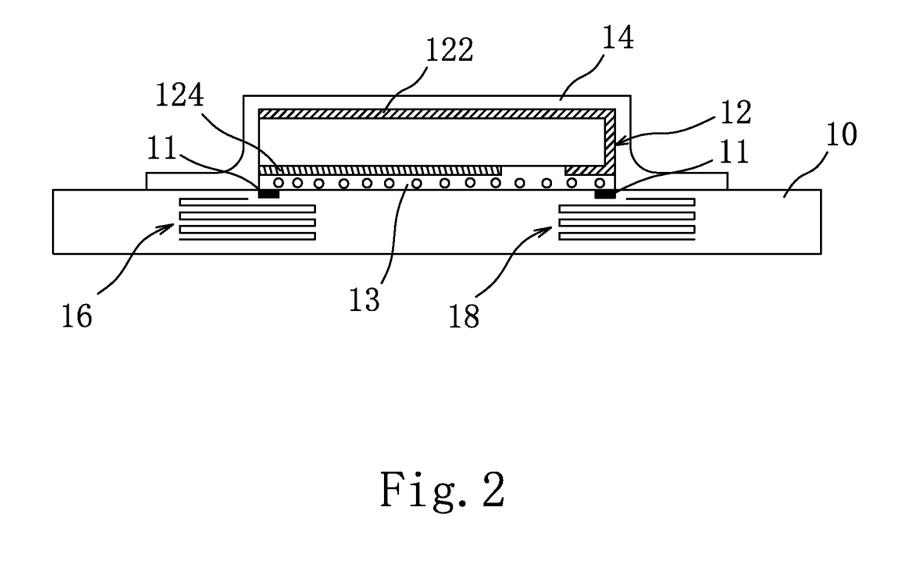
FIG. 2 is a cross-sectional view taken along Line A-A' of FIG. 1.

Refer to FIG. 2. FIG. 2 is a cross-sectional view taken along Line A-A' of FIG. 1. The flexible circuit board 10 comprises a plurality of layers of first strain gauges 16 correspondingly spaced from each other and a plurality of layers of second strain gauges 18 correspondingly spaced from each other. The first strain gauges 16 are arranged on different layers of the flexible circuit board 10, and the second strain gauges 18 are arranged on different layers of the flexible circuit board 10. The piezoelectric element 12 is arranged on the flexible circuit board 10 and arranged between the plurality of layers of the first strain gauges 16 and the plurality of layers of the second strain gauges 18. The upper surface and the lower surface of the piezoelectric element 12 respectively have a first electrode layer 122 and a second electrode layer 124, wherein the shape of the first electrode layer 122 is asymmetric to the shape of the second electrode layer 124. Each of the first electrode layer 122 and the second electrode layer 124 connects with the flexible circuit board 10 through a copper electrode 11. A conductive glue 13 is formed between the copper electrode 11 and either the first electrode layer 122 or the second electrode layer 124 to electrically connect the copper electrode 11 to either the first electrode layer 122 or the second electrode layer 124. The conductive glue 13 has a plurality of conductive particles. The package body 14 encapsulates the flexible circuit board 10 and the piezoelectric element 12 to complete the package process of the strain gauge driving piezoelectric device.

As mentioned above, the present invention uses one package process to encapsulate the first electrode layer 122 and the second electrode layer 124 of the upper and lower surfaces of the piezoelectric element 12 and the flexible circuit board 10. The package process is simplified to save the cost.

Figure 3:
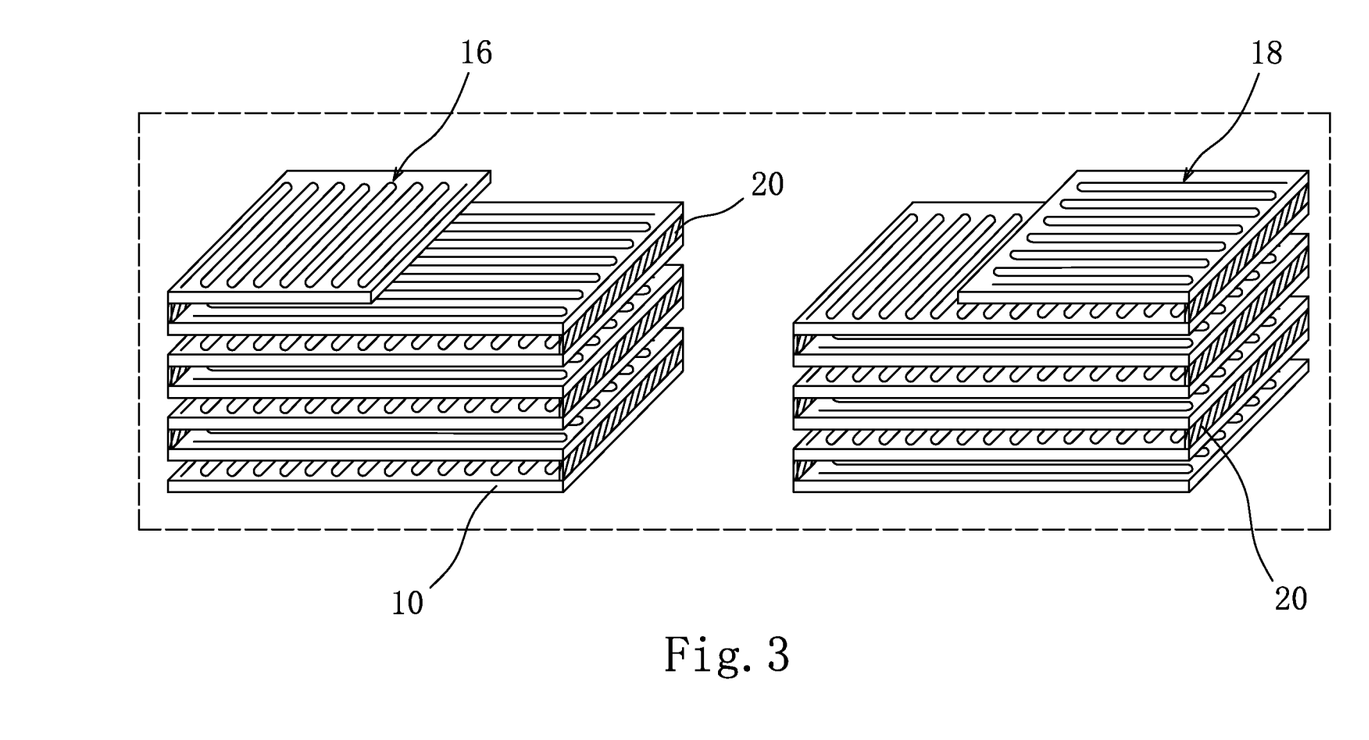
FIG. 3 is an enlarged view of a plurality of layers of strain gauges formed in a flexible circuit board according to an embodiment of the present invention.

Refer to FIG. 3. FIG. 3 is an enlarged view of a plurality of layers of strain gauges formed in a flexible circuit board according to an embodiment of the present invention. Each of the plurality of layers of the first strain gauges 16 and each of the plurality of layers of the second strain gauges 18 are formed by winding conductive metal wires. The best conductive metal wires are conductive copper wires. The directions of winding the conductive metal wires of neighboring two of the plurality of layers of the first strain gauges 16 and the plurality of layers of the second strain gauges 18 are perpendicular to each other. The area of a topmost one of the plurality of layers of the first strain gauges 16 is less than the area of each of remains of the plurality of layers of the first strain gauges 16, the areas of the remains of the plurality of layers of the first strain gauges 16 are equal, the area of a topmost one of the plurality of layers of the second strain gauges 18 is less than an area of each of remains of the plurality of layers of the second strain gauges 18, and the areas of the remains of the plurality of layers of the second strain gauges 18 are equal.

Limited by the size of the flexible circuit board 10, the resistance value of a topmost one of the plurality of layers of the first strain gauges 16 differs from the resistance value of each of the remains of the plurality of layers of the second strain gauges 18. As a result, in the embodiment, seven layers of the first strain gauges 16 and seven layers of the second strain gauges 18 are formed on different layers of the flexible circuit board 10. Finally, conductive glues 20 are used to cascade the seven layers of the first strain gauges 16 and the seven layers of the second strain gauges 18. Preferably, the conductive glues 20 are conductive copper glues. Thus, the sensitivity for detecting the amount of deformation of the flexible circuit board 10 in the X, Y, and Z directions is improved.

Figure 4:
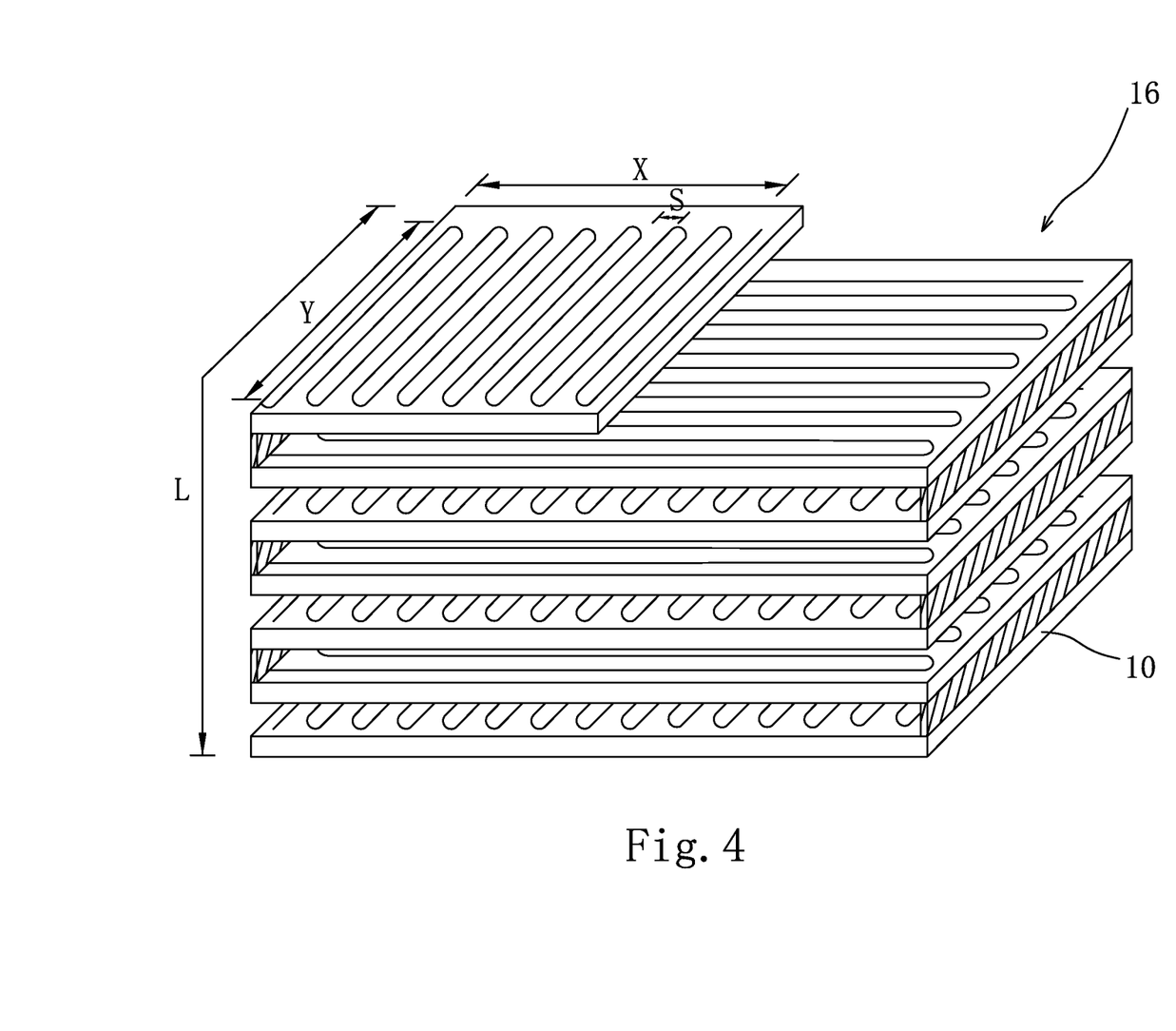
FIG. 4 is an enlarged view of a plurality of layers of first strain gauges according to an embodiment of the present invention.

Refer to FIG. 4. FIG. 4 is an enlarged view of a plurality of layers of first strain gauges according to an embodiment of the present invention. The variation of the resistance value of the strain gauge is related to the specification of the conductive copper wire, as shown by formulas (1) and (2).

$$L = X^* (Y/(W+S)) \quad (1)$$

L represents the total length of the conductive copper wire, X represents the length of the strain gauge, Y represent the width of the strain gauge, and S represents a line spacing between neighboring two of the line segments of the conductive copper wire.

$$R = \sigma^* L / t^* w \quad (2)$$

σ represents the resistivity of the conductive copper wire equal to $1.7*10^{-8}\Omega$, R represents the resistance of the conductive copper wire, t represents the thickness of the conductive copper wire, and w represents the width of the conductive copper wire.

According to formulas (1) and (2), the resistance value of the strain gauge is estimated. The strain gauge uses the variation of the resistance value of the conductive metal wire therein to measure the quantity of a strain. For a resistor, the resistance value is directly proportional to the length of the resistor. In an embodiment, when fabricating the flexible circuit board 10, the total resistance value of the first strain gauges 16 is designed to have a range of 960-1160 ohms, the conductive copper wire is designed to have a width of 38-42 µm, the line spacing between neighboring two of the line segments of the conductive copper wire is designed to have a range of 38-42 µm, and the thickness of the conductive copper wire is designed to have a range of 16-20 µm. For example, the conductive copper wire of the first layer of the strain gauges has a length X of 20 mm and a width Y of 18 mm. The sizes of the second layer to the seventh layer of the strain gauges are enlarged compared to the first layer of the strain gauges. The conductive copper wire of each of the second layer to the seventh layer of the strain gauges has a length X of 30 mm, a width Y of 18 mm, and a thickness of 18 µm. According to formulas (1) and (2), the first layer (R1) of the first strain gauges 16 has a resistance value of 106Ω, and each of the second layer (R2) to the seventh layer (R7) of the first strain gauges 16 has a resistance value of 159Ω. Thus, the first strain gauges 16 have a total resistance value of 1060Ω. Likewise, the first layer (R1') of the second strain gauges 18 has a resistance value of 106Ω, and each of the second layer (R2') to the seventh layer (R7') of the second strain gauges 18 has a resistance value of 159Ω. Thus, the second strain gauges 18 have a total resistance value of 1060Ω.

Figure 5:
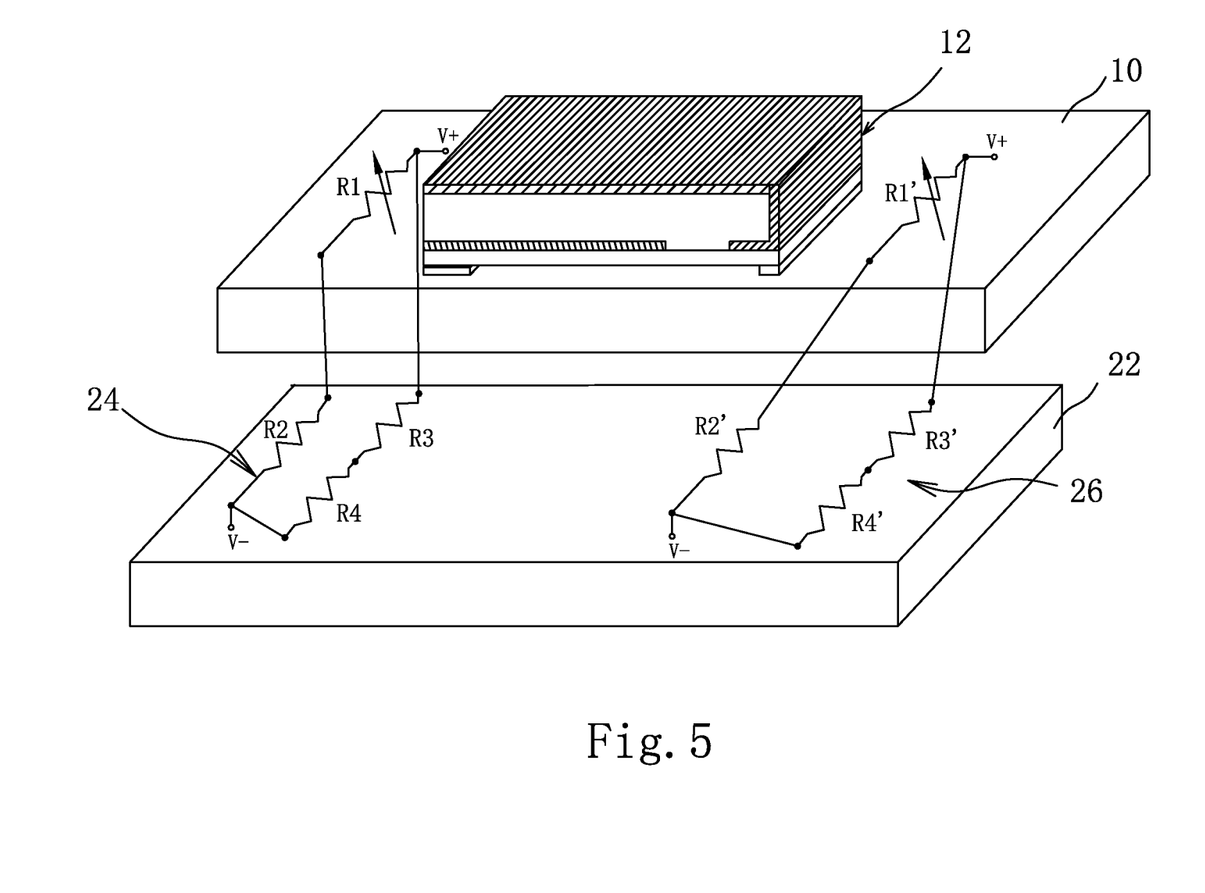
FIG. 5 is a diagram schematically showing strain gauges applied to a flexible circuit board according to an embodiment of the present invention.

In order to measure the tiny variation of the resistance, the strain gauges have to form a Wheatstone bridge circuit. The present invention avoids the balanced state of the Wheatstone bridge circuit. The balanced state represents that the driving voltage is zero. Refer to FIG. 5. FIG. 5 is a diagram schematically showing strain gauges applied to a flexible circuit board according to an embodiment of the present invention. An external circuit board 22 comprises a first Wheatstone bridge circuit 24 and a second Wheatstone bridge circuit 26. The first Wheatstone bridge circuit 24 includes three third strain gauges R2, R3, and R4 and electrically connects to the first strain gauges (R1) 16. The second Wheatstone bridge circuit 26 includes three fourth strain gauges R2', R3', and R4' and electrically connects to the second strain gauges 18. The flexible circuit board 10 is electrically connected to the external circuit board 22. In detail, the first strain gauges 16 and the second strain gauges 18 are formed on different layers of the flexible circuit board 10 and respectively arranged at two sides of the piezoelectric element 12. In order to improve the stability, the high resistance value of 1060 ohms is used to reduce the heat caused by inputting a high voltage. Each of the third strain gauges R2, R3, and R4 has a fixed resistance value of 1060 ohms and each of the fourth strain gauges R2', R3', and R4' has a fixed resistance value of 1060 ohms. The third strain gauges R2, R3, and R4 and the fourth strain gauges R2', R3', and R4' are fabricated on the external circuit board 22. When the flexible circuit board 10 receives a stress to deform, the third strain gauges R2, R3, and R4 and the fourth strain gauges R2', R3', and R4' do not change their resistance values. Thus, the design can guarantee the output voltage of the first Wheatstone bridge circuit 24 and the second Wheatstone bridge circuit 26 to be non-zero and improve the sensitivity of strain gauges. In addition, the flexible circuit board 10 of the present invention features excellent thermal conductivity. When the flexible circuit board 10 is locally heated at a temperature of 400° C., the flexible circuit board 10 rapidly dissipates the heat. Thus, the flexible circuit board 10 is not cracked. On top of that, the flexible circuit board 10 has the higher sensitivity and more deformation caused by an external pressure. In order to fabricate the strain gauge driving piezoelectric device into a slim and compact product, the piezoelectric element 12 of the present invention has a thickness of 400-1000 μm. In the embodiment, the piezoelectric element 12 has a thickness of 400 μm.

Figure 6:
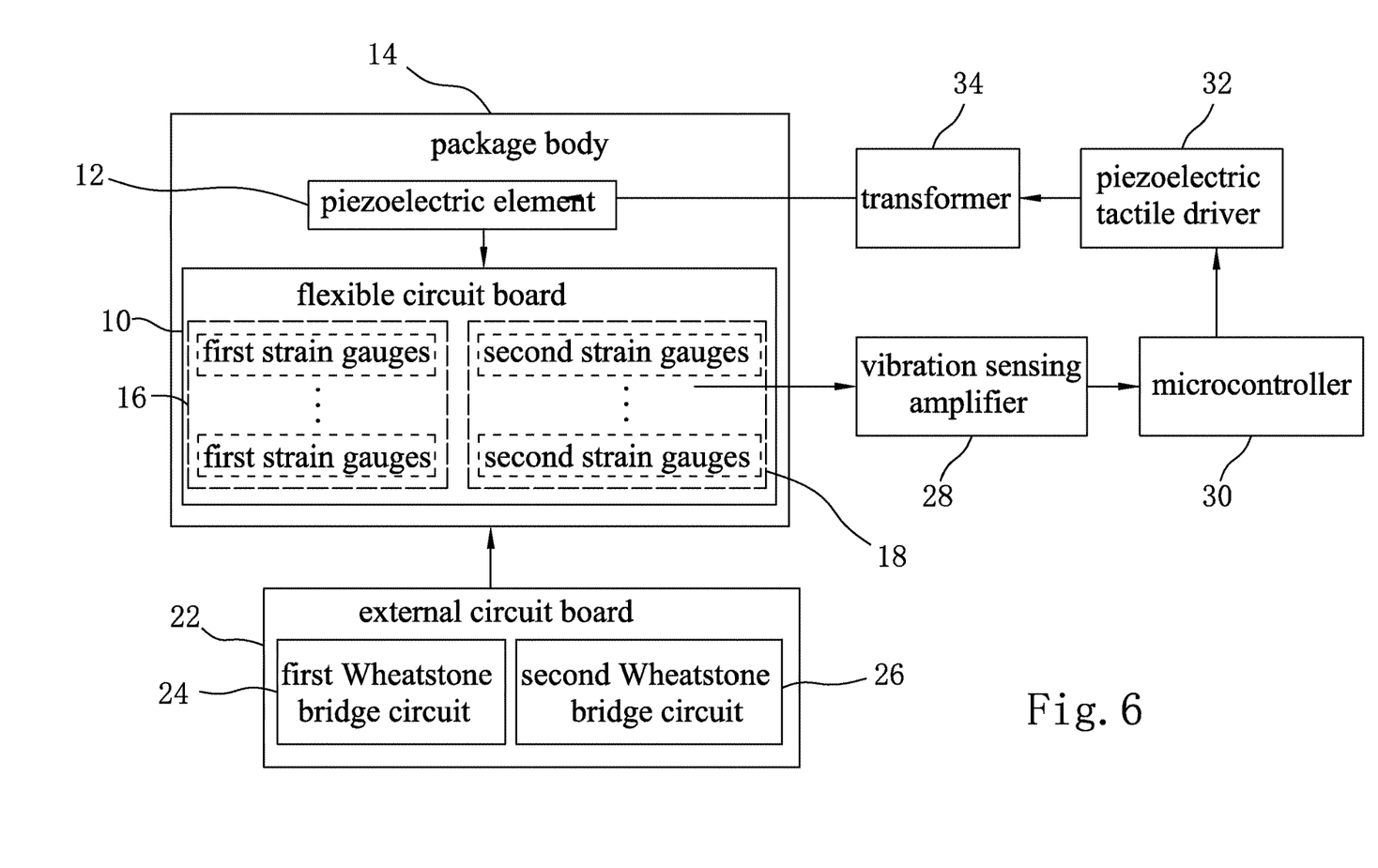
FIG. 6 is a diagram schematically showing a strain gauge driving piezoelectric device according to an embodiment of the present invention.

For the strain gauge driving piezoelectric device, the voltage generated by the strain gauge is very small. Refer to FIG. 6. FIG. 6 is a diagram schematically showing a strain gauge driving piezoelectric device according to an embodiment of the present invention. The strain gauge driving piezoelectric device further comprises a vibration sensing amplifier 28, a microcontroller 30, a piezoelectric tactile driver 32, and a transformer 34 that are electrically connected to each other. The vibration sensing amplifier 28 is electrically connected to the flexible circuit board 10. If the vibration makes a user feel haptic feedback, a voltage of 1000-2000 V may be used. The higher voltage can reduce the variation of the resistance of the conductive metal wire caused by the temperature variation. The first strain gauges 16 and the second strain gauges 18 generate a driving voltage according to the variations of resistance values of the first strain gauges 16 and the second strain gauges 18 when a stress is applied to the flexible circuit board 10. The driving voltage that is detected is very small. Thus, the vibration sensing amplifier 28 amplifies the driving voltage to generate a first amplified voltage. The vibration sensing amplifier 28 has a low biased current and a function of filtering out external high-frequency noise. Then, the microcontroller 30 uses the first amplified voltage to determine whether to start the piezoelectric tactile driver 32. The piezoelectric tactile driver 32 converts the first amplified voltage and then transmits it to the transformer 34. The first amplified voltage may be amplified again and then transmitted to the transformer 34. Alternatively, the piezoelectric tactile driver 32 converts the first amplified voltage into a pulse signal and then transmits it to the transformer 34. The transformer 34 amplifies the converted first amplified voltage to generate a second amplified voltage of 1000-2000 V, and uses the second amplified voltage to induce the piezoelectric effect of the piezoelectric element 12, such as the converse piezoelectric effect, and then to drive the piezoelectric element 12 to generate the output voltage for haptic feedback.

In conclusion, the present invention respectively arranges two independent Wheatstone bridge circuits at two sides of the piezoelectric element. A plurality of layers of one of strain gauges of each Wheatstone bridge circuit are cascaded to each other and formed in the flexible circuit board. Each layer of the strain gauges is formed by winding conductive metal wires and designed to have high resistance, thereby reducing the misjudgement on noise of signals transmitted and improving the sensitivity and stability of the strain gauges. The remaining strain gauges of each Wheatstone bridge circuit are formed in the external circuit board. This design can guarantee the output voltage of the Wheatstone bridge circuits to be non-zero, applies to touch products to cause the more precise haptic feedback, and possesses the market competitiveness.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A strain gauge driving piezoelectric device comprising:
   a flexible circuit board comprising a plurality of layers of first strain gauges correspondingly spaced from each other and a plurality of layers of second strain gauges correspondingly spaced from each other, the first strain gauges are arranged on different layers of the flexible circuit board, the second strain gauges are arranged on different layers of the flexible circuit board, and the plurality of layers of the first strain gauges and the plurality of layers of the second strain gauges are respectively cascaded through conductive glues;
   a piezoelectric element arranged on the flexible circuit board and arranged between the plurality of layers of the first strain gauges and the plurality of layers of the second strain gauges, an upper surface and a lower surface of the piezoelectric element respectively have a first electrode layer and a second electrode layer, a shape of the first electrode layer is asymmetric to a shape of the second electrode layer, the first strain gauges and the second strain gauges generate a driving voltage according to variations of resistance values of the first strain gauges and the second strain gauges when a stress is applied to the flexible circuit board, and the driving voltage induces a piezoelectric effect of the piezoelectric element and then drives the piezoelectric element to generate an output voltage; and
   a package body encapsulating the flexible circuit board and the piezoelectric element.

2. The strain gauge driving piezoelectric device according to claim 1, wherein each of the plurality of layers of the first strain gauges and each of the plurality of layers of the second strain gauges are formed by winding conductive metal wires, and directions of winding the conductive metal wires of neighboring two of the plurality of layers of the first strain gauges and the plurality of layers of the second strain gauges are perpendicular to each other.

3. The strain gauge driving piezoelectric device according to claim 2, wherein an area of a topmost one of the plurality of layers of the first strain gauges is less than an area of each of remains of the plurality of layers of the first strain gauges, the areas of the remains of the plurality of layers of the first strain gauges are equal, an area of a topmost one of the plurality of layers of the second strain gauges is less than an area of each of remains of the plurality of layers of the second strain gauges, and the areas of the remains of the plurality of layers of the second strain gauges are equal.

4. The strain gauge driving piezoelectric device according to claim 2, wherein the conductive metal wires are conductive copper wires, the conductive copper wire of each of the plurality of layers of the first strain gauges and the plurality of layers of the second strain gauges is divided into line segments in parallel to each other, a line spacing between neighboring two of the line segments has a range of 38-42 µm, the conductive copper wire has a width of 38-42 µm, and the conductive copper wire has a thickness of 16-20 µm.

5. The strain gauge driving piezoelectric device according to claim 1, wherein the flexible circuit board is electrically connected to an external circuit board, the external circuit board comprises a first Wheatstone bridge circuit and a second Wheatstone bridge circuit that correspond to each other, the first Wheatstone bridge circuit includes three third strain gauges and electrically connects to the first strain gauges, the second Wheatstone bridge circuit includes three fourth strain gauges and electrically connects to the second strain gauges, and the first Wheatstone bridge circuit and the second Wheatstone bridge circuit adjust the driving voltage to non-zero.

6. The strain gauge driving piezoelectric device according to claim 5, further comprising a vibration sensing amplifier, a microcontroller, a piezoelectric tactile driver, and a transformer that are electrically connected to each other, the vibration sensing amplifier electrically connected to the flexible circuit board amplifies the driving voltage to generate a first amplified voltage, the microcontroller uses the first amplified voltage to start the piezoelectric tactile driver, the piezoelectric tactile driver converts the first amplified voltage and then transmits it to the transformer, the transformer amplifies a converted the first amplified voltage to generate a second amplified voltage, and uses the second amplified voltage to induce the piezoelectric effect of the piezoelectric element and then to drive the piezoelectric element to generate the output voltage.

7. The strain gauge driving piezoelectric device according to claim 1, wherein the conductive glues are conductive copper glues.

8. The strain gauge driving piezoelectric device according to claim 1, wherein the piezoelectric element is a piezoelectric ceramic element.

9. The strain gauge driving piezoelectric device according to claim 1, wherein the first electrode layer and the second electrode layer are silver electrode layers.

10. The strain gauge driving piezoelectric device according to claim 1, wherein a resistance value of the first strain gauges has a range of 960-1160 ohms, and a resistance value of the second strain gauges has a range of 960-1160 ohms.

* * * * *